(12) United States Patent
Jung et al.

(10) Patent No.: US 7,332,378 B2
(45) Date of Patent: Feb. 19, 2008

(54) INTEGRATED CIRCUIT MEMORY SYSTEM WITH DUMMY ACTIVE REGION

(75) Inventors: Sung Mun Jung, Singapore (SG); Ching Dong Wang, Singapore (SG); Louis Yoke Leng Lim, Singapore (SG); Swee Tuck Woo, Singapore (SG); Donghua Liu, Singapore (SG); Xiaoyu Chen, Singapore (SG)

(73) Assignee: Chartered Semiconductor Manufacturing Ltd., Singapore (SG)

( * ) Notice: Subject to any disclaimer, the term of this patent is extended or adjusted under 35 U.S.C. 154(b) by 96 days.

(21) Appl. No.: 11/308,061

(22) Filed: Mar. 4, 2006

(65) Prior Publication Data

US 2007/0207558 A1    Sep. 6, 2007

(51) Int. Cl.
   *H01L 21/82*    (2006.01)
(52) U.S. Cl. .............. 438/129; 438/128; 438/599; 257/202; 257/208; 257/390; 257/E21.645
(58) Field of Classification Search .......... 438/599; 257/E21.598, E21.613, E21.615, E21.662, 257/E21.667

See application file for complete search history.

(56) References Cited

U.S. PATENT DOCUMENTS

| | | | |
|---|---|---|---|
| 6,707,078 B1 | 3/2004 | Shiraiwa et al. | 257/208 |
| 6,806,518 B2 | 10/2004 | Kim et al. | 257/210 |
| 2002/0173107 A1* | 11/2002 | Doong et al. | 438/301 |
| 2005/0205894 A1* | 9/2005 | Sumikawa et al. | 257/202 |

* cited by examiner

*Primary Examiner*—Michael Lebentritt
*Assistant Examiner*—Cheung Lee
(74) *Attorney, Agent, or Firm*—Mikio Ishimaru

(57) ABSTRACT

An integrated circuit memory system including a substrate formed with equidistant spaced shallow trench isolation regions. Forming active regions and dummy active regions within the substrate between the equidistant spaced shallow trench isolation regions. Forming sources and drains within the active regions. Providing wordlines and source lines extending in a first direction and bitlines extending in a second direction. Forming contact regions over the dummy active regions for strapping the wordlines and the source lines to the bitlines.

20 Claims, 3 Drawing Sheets

INTEGRATED CIRCUIT MEMORY SYSTEM WITH DUMMY ACTIVE REGION

TECHNICAL FIELD

The present invention relates generally to integrated circuits, and more particularly to an integrated circuit memory system.

BACKGROUND ART

Integrated circuit (IC) products can be found in most electronic devices throughout the world. The most familiar applications of IC products are found in cellphones, camcorders, portable music players, televisions, and computers. Almost all of these product types employ some form of memory, whether it be read-only memory (ROM), or random-access memory (RAM). ROM and RAM can also be classified as nonvolatile and volatile memory, respectively. Volatile memory is a semiconductor device that allows data to be stored and changed as desired; data in the volatile memory is lost when the power is turned off. Nonvolatile memory is a semiconductor device designed to store digital data in the form of an electrical charge, wherein the charge remains in storage even after the power is turned off.

Flash memory is a type of nonvolatile memory that can be erased and reprogrammed many times. Flash memory is usually constructed by one of two technologies, floating gate or silicon-oxide-nitride-oxide-silicon (SONOS). Recently, SONOS technology is considered to be a promising solution for not only nonvolatile stand alone memory, but also embedded memory due to its numerous advantages, such as, excellent scalability, low power consumption, process simplicity, and logic process compatibility.

Unfortunately, flash memory, including SONOS flash, is usually required to force erase bias for 64 kbytes simultaneously (called a "sector erase"). This sector erase method can suffer from low erase quality unless every bit within the sector displays uniform characteristics. The properties affecting uniform characteristics between bits are: active region critical dimension, channel mobility stresses due to shallow trench isolation (STI) formations, and charge trapping in oxide-nitride-oxide (ONO) layers of the SONOS. The problems associated with these properties are exacerbated by the large sector sizes used in today's flash memories.

Large sector sizes require long wordlines and source lines, which are prone to resistive/capacitive (RC) delay due to their material composition. For instance, the RC delay of a polysilicon wordline exceeds that of a metal bitline. Consequently, strapping of the wordlines with metal lines is required in order to achieve reasonable access times. Strapping is the process of shorting a polysilicon wordline, by electrically interconnecting the wordline to a metal line, to significantly reduce the resistance and access time of the wordline.

Strapping requires the use of drop contacts within contact regions, every certain distance. Drop contacts are electrical interconnections formed between the polysilicon wordlines and the metal lines. Unfortunately, these drop contacts require extra area that create discontinuities in layout pattern spacing. These discontinuities in spacing detrimentally affect the performance of the bits adjacent the drop contacts.

The bits adjacent the drop contact regions have a tendency to display dissimilar characteristics from other bits. These dissimilar characteristics arise due to two kinds of problems. The first is that the active critical dimension (CD) region of the bits nearest the drop contact regions are different from that of other bits, and the mobility of the channel may be different due to STI stresses as well. The other problem is that the nearest bit usually suffers from plasma damage incurred during the contact and via etch processes. During the etch of the drop contact regions, charged particles from the plasma disperse into the polysilicon gate line and the ONO layer, where most of the charges can be trapped in the nitride film of the closest bits, and degrade ONO integrity.

Thus, a need still remains for a memory array with uniform cell characteristics that increases the reliability of sector erasures. In view of the ever-increasing need to save costs and improve efficiencies, it is more and more critical that answers be found to these problems.

Solutions to these problems have been long sought but prior developments have not taught or suggested any solutions and, thus, solutions to these problems have long eluded those skilled in the art.

DISCLOSURE OF THE INVENTION

The present invention provides an integrated circuit memory system by forming a substrate with equidistant spaced shallow trench isolation regions. Forming active regions and dummy active regions within the substrate between the equidistant spaced shallow trench isolation regions. Forming sources and drains within the active regions. Providing wordlines and source lines extending in a first direction and bitlines extending in a second direction. Forming contact regions over the dummy active regions for strapping the wordlines and the source lines to the bitlines.

Certain embodiments of the invention have other advantages in addition to or in place of those mentioned above. The advantages will become apparent to those skilled in the art from a reading of the following detailed description when taken with reference to the accompanying drawings.

BEST MODE FOR CARRYING OUT THE INVENTION

Figure 1:
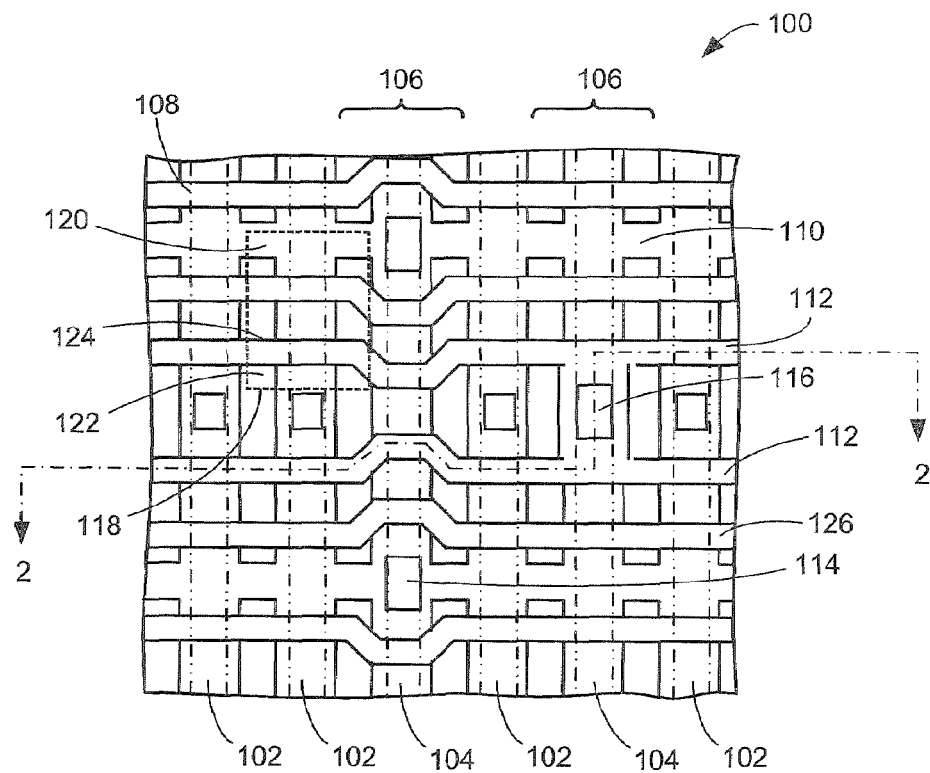
FIG. 1 is a plan view of a portion of an integrated circuit memory system in accordance with an embodiment of the invention.

The following embodiments are described in sufficient detail to enable those skilled in the art to make and use the invention, and it is to be understood that other embodiments would be evident based on the present disclosure and that process or mechanical changes may be made without departing from the scope of the present invention.

In the following description, numerous specific details are given to provide a thorough understanding of the invention. However, it will be apparent that the invention may be practiced without these specific details. In order to avoid obscuring the present invention, some well-known system configurations, and process steps are not disclosed in detail. Likewise, the drawings showing embodiments of the invention are semi-diagrammatic and not to scale and, particularly, some of the dimensions are for the clarity of presentation and are shown exaggerated in the drawing FIGS. In addition, where multiple embodiments are disclosed and described having some features in common, for clarity and ease of illustration, description, and comprehension thereof, similar and like features one to another will ordinarily be described with like reference numerals.

The term "horizontal" as used herein is defined as a plane parallel to the plane or surface of the substrate, regardless of its orientation. The term "vertical" refers to a direction perpendicular to the horizontal as just defined. Terms, such as "on", "above", "below", "bottom", "top", "side" (as in "sidewall"), "higher", "lower", "upper", "over", and "under", are defined with respect to the horizontal plane. The term "processing" as used herein includes deposition of material or photoresist, patterning, exposure, development, etching, cleaning, and/or removal of the material or photoresist as required in forming a described structure.

As mentioned above, contact regions within a memory array, can create discontinuities in a layout pattern spacing of active regions. The STI formations within the contact regions are typically larger than other STI formations within the memory array. This increase in size adversely affects the critical dimension regions of adjacent active regions, introduces non-uniform channel mobility stresses, and increases the likelihood of plasma etch damage to adjacent active regions. The present invention eliminates these problems by creating a uniform layout pattern spacing of STI formations that improves sector erase quality.

Referring now to FIG. 1, therein is shown a plan view of a portion of an integrated circuit memory system 100 in accordance with an embodiment of the invention. The system 100 includes active regions 102 and dummy active regions 104 within contact regions 106. The contact regions 106 provide an electrical connection between bitlines 108 (shown in phantom outline) and source lines 110 and/or wordlines 112. The bitlines 108 contact the source lines 110 through source contacts 114 and the bitlines 108 contact the wordlines 112 through wordline contacts 116.

The source contacts 114 and the wordline contacts 116 are necessary because the source lines 110 and the wordlines 112 commonly include silicon and the bitlines 108 commonly include metal. Since the RC delay time of silicon exceeds that of metal, the bitlines 108 are strapped to the source lines 110 and the wordlines 112, through the source contacts 114 and the wordline contacts 116, respectively, to achieve reasonable address times.

FIG. 1 depicts by way of example and not by way of limitation, one of the dummy active regions 104 accommodating the source contacts 114 and another one of the dummy active regions 104 accommodating the wordline contacts 116. One of the advantages of configuring the source contacts 114 and the wordline contacts 116 in separate areas is that a continuous layout pattern for the source lines 110 and the wordlines 112 can be achieved. The continuous layout pattern is achieved by forming the source lines 110 and the wordlines 112 around the source contacts 114, while the wordlines 112 are electrically bridged together at the wordline contacts 116. Alternatively, the dummy active regions 104 could accommodate both the source contacts 114 and the wordline contacts 116.

The active regions 102 of FIG. 1 include memory cells 118, further including sources 120, drains 122 and gates 124. The sources 120 are connected to source lines 110, the drains 122 are connected to the bitlines 108 and the gates 124 are connected to the wordlines 112. The source lines 110 and wordlines 112 extend in a first direction while the bitlines 108 extend in a second direction. The memory cells 118 are additionally accessed by a select line 126.

Figure 2:
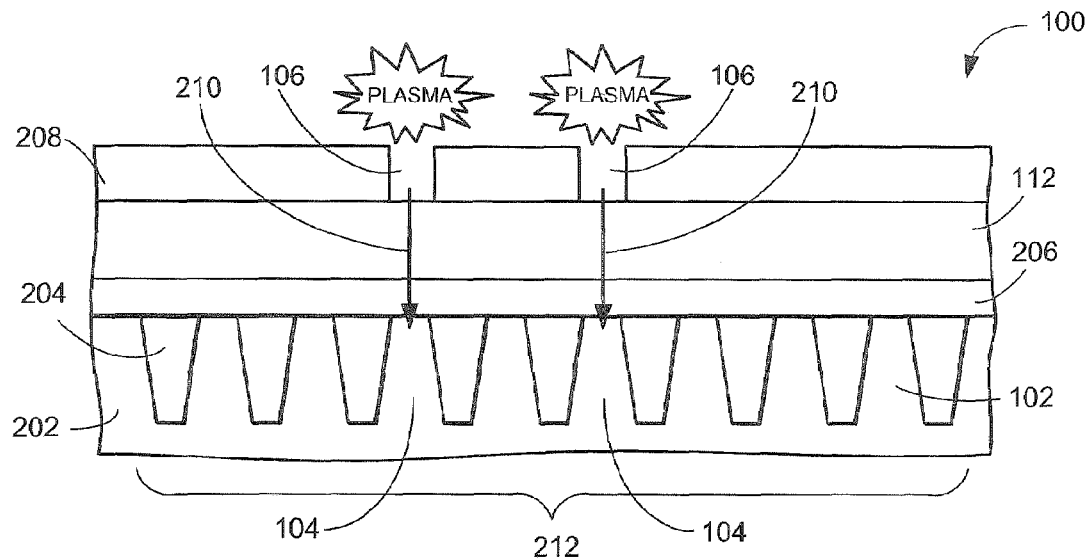
FIG. 2 is an expanded cross-sectional view of FIG. 1 along line 2-2 in an intermediate stage of manufacturing.

Referring now to FIG. 2, therein is shown an expanded cross-sectional view of FIG. 1 along line 2-2 in an intermediate stage of manufacturing. The system 100 includes the active regions 102, the dummy active regions 104, the contact regions 106, the wordlines 112, a substrate 202, STI formations 204, charge trapping layers 206, a dielectric 208, and plasma induced charges 210. By way of example and not by way of limitation, the charge trapping layers 206 can be an oxide-nitride-oxide (ONO) layer, or more specifically, the charge trapping layers 206 can be a part of a silicon-oxide-nitride-oxide-silicon (SONOS) configuration.

Most notably, FIG. 2 depicts the equidistant spacing between STI formations 204. By forming the STI formations 204 of approximately equal size and spacing, the discontinuities created by unequal sized STI formations can be prevented. Unequal sized STI formations can adversely affect critical dimensions, such as width of a channel, of a field-effect-transistor located within the active regions 102 adjacent the contact regions 106. Since variances in channel width can lead to field-effect-transistors that operate at different speeds within the integrated circuit memory system 100, uniformity of memory access times can be greatly affected.

By configuring the layout pattern of the STI formations 204 with equidistant spacing, the active regions 102 and the dummy active regions 104 substantially all possess equidistant critical dimension spacing. This type of STI formation pattern can be called equidistant spaced shallow trench isolation regions 212. Therefore, the active regions 102 adjacent the dummy active regions 104 now possess a critical dimension equivalent to substantially all other critical dimensions within the memory array. This uniform critical dimension allows substantially all the memory cells 118 within the memory array to display similar device performance characteristics, which in turn enhances the quality of sector erase functions.

Additionally, by configuring the STI formations 204 with an equidistant layout pattern, differences in channel mobility stresses within the active regions 102 adjacent the contact regions 106 can be minimized. Channel mobility stresses are due in part to the dissimilarity in thermal expansion between the STI formations 204 (normally an oxide) and the substrate 202 (normally a semiconductor). Differences in channel mobility stresses arise within a memory array when unequal sized STI trenches are formed within a substrate 202. These channel stresses can either degrade a cells performance or enhance a cells performance, thereby creating discontinuities with other cells.

Either way, the active regions 102 adjacent the contact regions 106 with larger or smaller STI trenches displays different channel mobility stresses due to the non-uniform STI trenches, which in turn affects sector erase quality. It has been discovered that the present invention eliminates non-uniform channel mobility stresses by forming the STI formations 204 of approximately equal size and in an equidistant layout pattern. Since substantially all the active regions 102 of the present invention exhibit uniform channel mobility stresses, the quality of a uniform sector erase is improved.

Finally, plasma induced charges 210 that occur during the contact and via etch of the contact regions 106 can be damaging to a memory array. As mentioned above, larger STI trenches formed within the contact regions 106 blocked the flow of the plasma induced charges 210 and diverted them through the charge trapping layers 206 and the wordlines 112 adjacent the contact regions 106. The diversion of the plasma induced charges 210 causes them to become ensnared within the charge trapping layers 206 of the active regions 102 adjacent the contact regions 106, and consequently, degrades the integrity of the charge trapping layers 206. This in turn affected the uniformity of the active regions 102 and decreased the quality of sector erase functions.

The present invention solves this problem by forming the STI formations 204 in an equidistant spaced apart manner, which allows the dummy active regions 104 to be formed beneath the contact regions 106. The dummy active regions 104 do not block the plasma induced charges 210 but instead absorb the plasma induced charges 210. Since the dummy active regions 104 absorb the plasma induced charges 210, the charge trapping layers 206 and the wordlines 12 consequently do not serve as conduits for dissipation of the plasma induced charges 210. Accordingly, the integrity of the charge trapping layers 206 adjacent the dummy active regions 104 are maintained and the quality of a sector erase operation is enhanced.

Figure 3:
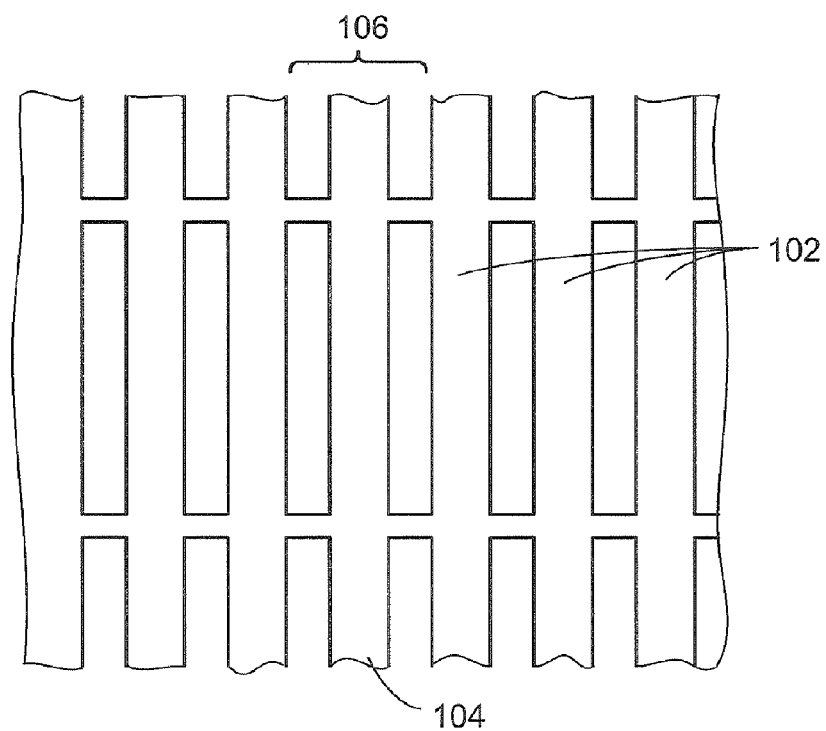
FIG. 3 is a plan view of an L10 layout pattern in accordance with an embodiment of the present invention.

Referring now to FIG. 3, therein is shown a plan view of an L10 layout pattern in accordance with an embodiment of the present invention. FIG. 3 illustrates how the present invention may employ a new L10 layout pattern (commonly referred to as an active area mask) to create an array layout technique wherein the spacing between substantially all the active regions 102 and the dummy active regions 104 is approximately equidistant. As mentioned above, discontinuities in spacing of the active regions 102 lessen the quality of a sector erase operation due to non-uniform bit characteristics. Therefore, by eliminating the discontinuities in spacing, the dummy active regions 104 of the present invention create equal critical dimensions amongst substantially all the active regions 102, prevent STI channel mobility stresses, and prevent degradation of the charge trapping layers 206 (not shown) during etching.

Figure 4:
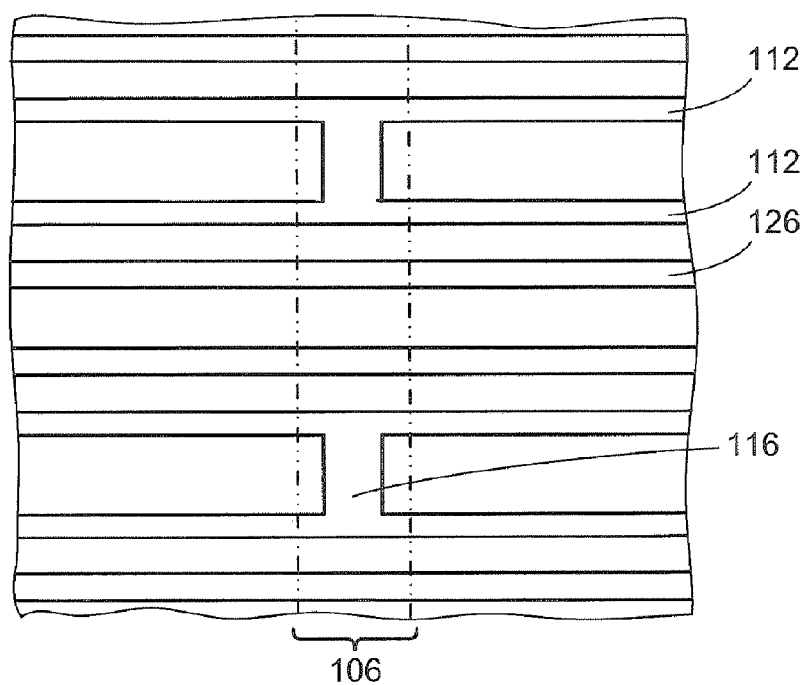
FIG. 4 is a plan view of an L60 layout pattern in accordance with an embodiment of the present invention.

Referring now to FIG. 4, therein is shown a plan view of an L60 layout pattern in accordance with an embodiment of the present invention. FIG. 4 illustrates how the present invention employs a new L60 layout pattern (commonly referred to as a poly mask) to form the wordlines 112 and the select lines 126 without interruption. The present invention is able to avoid discontinuities within the select lines 126 by forming the wordlines 112 adjacent to one another and electrically bridging them through the wordline contacts 116. By forming the wordlines 112 adjacent to one another, one of the dummy active regions 104 (not shown) can accommodate the wordline contacts 116 within the contact regions 106 (shown in phantom outline), and another of the dummy active regions 104 can accommodate the source contacts 114 (not shown). This configuration allows for a uniform uninterrupted layout pattern for the wordlines 112 and the select lines 126.

Figure 5:
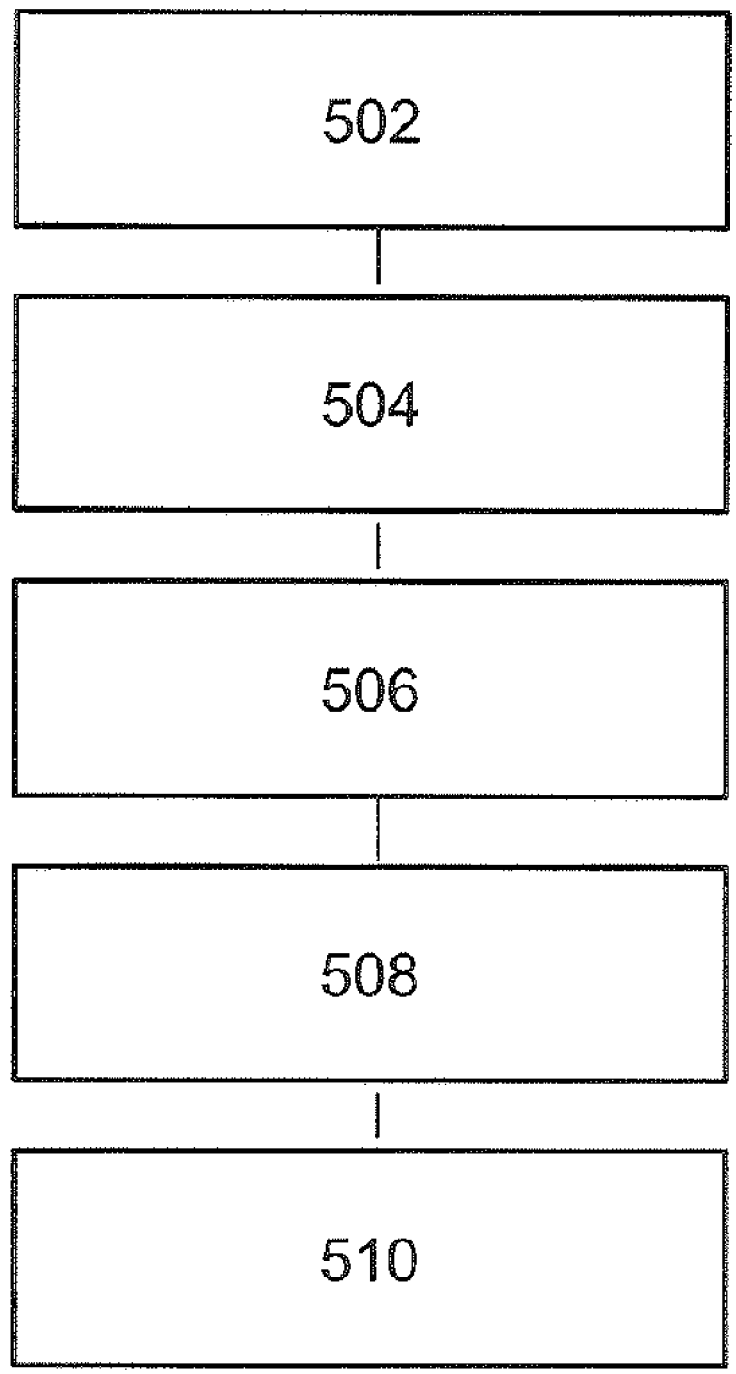
FIG. 5 is a flow chart for an integrated circuit memory system for fabricating the integrated circuit memory system in accordance with an embodiment of the present invention.

Referring now to FIG. 5, therein is shown a flow chart for an integrated circuit memory system 500 for fabricating the integrated circuit memory system 100 in accordance with an embodiment of the present invention. The integrated circuit memory system 500 includes forming a substrate with equidistant spaced shallow trench isolation regions in a block 502; forming active regions and dummy active regions within the substrate between the equidistant spaced shallow trench isolation regions in a block 504; forming source and drain regions within the active regions in a block 506; providing wordlines and source lines extending in a first direction and bitlines extending in a second direction in a block 508; and forming contact regions over the dummy active regions for strapping the wordlines and the source lines to the bitlines in a block 510.

It has been discovered that the present invention thus has numerous advantages. A principle advantage is that the present invention creates a memory array with a uniform critical dimension within each active region. By creating a memory array with uniform critical dimensions, substantially all active regions then display similar device characteristics, thereby enhancing sector erase quality.

Another advantage is the equalization of channel mobility stresses. By equalizing substantially all the channel mobility stresses within the active regions, the uniformity of cell characteristics is improved and the memory arrays sector erase quality is also enhanced.

Yet still another advantage is the reduction of damage to the charge trapping layers during plasma etch. By forming the dummy active region beneath the contact regions, the dummy active regions can act as absorbers of the plasma induced charges and prevent the charges from becoming entrapped within adjacent charge trapping layers.

Yet another important advantage of the present invention is that it valuably supports and services the historical trend of reducing costs, simplifying systems, and increasing performance.

These and other valuable aspects of the present invention consequently further the state of the technology to at least the next level.

Thus, it has been discovered that the integrated circuit system of the present invention furnishes important and heretofore unknown and unavailable solutions, capabilities, and functional advantages. For instance, by providing a process that normalizes critical dimensions of active regions, that creates uniform channel mobility stresses, and reduces the amount of charge trapping layer damage during plasma etching, the sector erase quality of a memory array can be enhanced. The resulting processes and configurations are straightforward, cost-effective, uncomplicated, highly versatile and effective, can be implemented by adapting known technologies, and are thus readily suited for efficient and economical manufacturing.

While the invention has been described in conjunction with a specific best mode, it is to be understood that many alternatives, modifications, and variations will be apparent to those skilled in the art in light of the aforegoing description. Accordingly, it is intended to embrace all such alternatives, modifications, and variations which fall within the scope of the included claims. All matters hithertofore set forth herein or shown in the accompanying drawings are to be interpreted in an illustrative and non-limiting sense.

What is claimed is:

1. An integrated circuit memory system comprising:
    forming a substrate with equidistant spaced shallow trench isolation regions;
    forming active regions and dummy active regions within the substrate between the equidistant spaced shallow trench isolation regions;
    forming sources and drains within the active regions;
    providing wordlines and source lines extending in a first direction and bitlines extending in a second direction; and
    forming contact regions over the dummy active regions for strapping the wordlines and the source lines to the bitlines.

2. The system as claimed in claim 1 further comprising:
forming charge trapping layers beneath the wordlines.

3. The system as claimed in claim 1 wherein:
forming the equidistant spaced shallow trench isolation regions creates an uniform equidistant critical dimension in substantially all active regions.

4. The system as claimed in claim 1 wherein:
forming the equidistant spaced shallow trench isolation regions prevents absorption of plasma charges by adjacent active regions during etching.

5. The system as claimed in claim 1 wherein:
forming the equidistant spaced shallow trench isolation regions eliminates the shallow trench isolation stresses that affect channel mobility.

6. An integrated circuit memory system comprising:
forming a substrate with shallow trench isolation formations spaced equally apart;
forming dummy active regions between the shallow trench isolation formations located below contact regions;
forming active regions between the shallow trench isolation formations not below the contact regions;
forming sources and drains within the active regions;
forming charge trapping layers over the active regions;
forming wordlines and source lines extending in a first direction;
forming bitlines extending in a second direction over the wordlines and the source lines; and
forming wordline contacts and source contacts within the contact regions for strapping the wordlines and the source lines to the bitlines.

7. The system as claimed in claim 6 wherein:
forming the charge trapping layers includes forming ONO layers.

8. The system as claimed in claim 6 wherein:
forming the charge trapping layers includes forming SONOS non-volatile memory cells.

9. The system as claimed in claim 6 further comprising:
configuring the system such that substantially all the active regions exhibit uniform performance characteristics.

10. The system as claimed in claim 6 further comprising:
configuring the system for uniform sector erases.

11. An integrated circuit memory system comprising:
a substrate with equidistant spaced shallow trench isolation regions;
active regions and dummy active regions within the substrate between the equidistant spaced shallow trench isolation regions;
sources and drains within the active regions;
wordlines and source lines extending in a first direction and bitlines extending in a second direction; and
contact regions over the dummy active regions for strapping the wordlines and the source lines to the bitlines.

12. The system as claimed in claim 11 further comprising:
charge trapping layers beneath the wordlines.

13. The system as claimed in claim 12 wherein:
the charge trapping layers include ONO layers.

14. The system as claimed in claim 12 wherein:
the charge trapping layers include forming SONOS non-volatile memory cells.

15. The system as claimed in claim 11 wherein:
the equidistant spaced shallow trench isolation regions create an uniform equidistant critical dimension in substantially all active regions.

16. The system as claimed in claim 11 wherein:
the equidistant spaced shallow trench isolation regions prevent absorption of plasma charges by adjacent active regions during etching.

17. The system as claimed in claim 11 wherein:
the equidistant spaced shallow trench isolation regions eliminates shallow trench isolation stresses that affect channel mobility.

18. The system as claimed in claim 11 wherein:
the contact regions may include either or both source contacts and wordline contacts.

19. The system as claimed in claim 11 wherein:
the system is configured such that substantially all the active regions exhibit uniform performance characteristics.

20. The system as claimed in claim 11 wherein:
the system is configured for uniform sector erases.

* * * * *